United States Patent
Haralabidis (10) Patent No.: US 8,611,842 B2
(45) Date of Patent: Dec. 17, 2013

(54) APPARATUS AND METHOD FOR FAST PHASE LOCKED LOOP (PLL) SETTLING FOR CELLULAR TIME-DIVISION DUPLEX (TDD) COMMUNICATIONS SYSTEMS

(75) Inventor: Nikoloas Haralabidis, Athens (GR)

(73) Assignee: Broadcom Corporation, Irvine, CA (US)

( * ) Notice: Subject to any disclaimer, the term of this patent is extended or adjusted under 35 U.S.C. 154(b) by 58 days.

(21) Appl. No.: 13/356,137

(22) Filed: Jan. 23, 2012

(65) Prior Publication Data
US 2013/0113535 A1    May 9, 2013

Related U.S. Application Data

(60) Provisional application No. 61/556,094, filed on Nov. 4, 2011.

(30) Foreign Application Priority Data

Dec. 28, 2011   (GR) .............................. 20110100740

(51) Int. Cl.
*H04B 1/06*    (2006.01)
*H04B 7/00*    (2006.01)

(52) U.S. Cl.
USPC ...... 455/260; 455/243.2; 455/323; 455/550.1

(58) Field of Classification Search
USPC ........ 455/255–260, 230, 232.1, 234.1, 234.2, 455/323, 324, 550.1
See application file for complete search history.

(56) References Cited

U.S. PATENT DOCUMENTS 8,010,072 B1 *    8/2011    Nathawad ..................... 455/260
2007/0249293 A1 *    10/2007    Chae et al. ..................... 455/76

* cited by examiner

*Primary Examiner* — Nhan Le
(74) *Attorney, Agent, or Firm* — Sterne, Kessler, Goldstein & Fox P.L.L.C.

(57) ABSTRACT

A communications device is disclosed that adjusts a target signal to allow a reference phase locked loop (PLL) to lock onto a reference signal that is related to a desired operating frequency in a first mode of operation. The reference PLL locks onto the reference signal when the target signal is calibrated to be proportional to the reference signal. As the communications device transitions between the first mode of operation and a second mode of operation, the communications device performs a shorten calibration cycle on the reference PLL. The reference phase locked loop (PLL) locks onto the reference signal in response to the shorten calibration cycle in the second mode of operation.

20 Claims, 5 Drawing Sheets

Calibration Period Requirements Based on Operation and Communication Standard for Communications Device

| Communication Standard | Calibration Period for Initial Channel Engagement Operation | Calibration Period for Transition from Receive to Transmit Operation | Calibration Period for Transition from Transmit to Receive Operation |
|---|---|---|---|
| Second-Generation Wireless Telephone Technology (2G) | ≤ 200 µs Full Calibration Applied | ≤ 200 µs Full Calibration Applied | ≤ 200 µs Full Calibration Applied |
| Third-Generation Wireless Telephone Technology (3G) | ≤ 200 µs Full Calibration Applied | ≤ 200 µs Full Calibration Applied | ≤ 200 µs Full Calibration Applied |
| Long Term Evolution Frequency-Division Duplexing (LTE FDD) | ≤ 200 µs Full Calibration Applied | ≤ 200 µs Full Calibration Applied | ≤ 200 µs Full Calibration Applied |
| Long Term Evolution Time-Division Duplexing (LTE TDD) | ≤ 200 µs Full Calibration Applied | ≤ 71.3 µs Fine Calibration Applied | ≤ 47 µs Fine Calibration Applied |
| Time Division Synchronous Code Division Multiple Access (TD-SCDMA) | ≤ 200 µs Full Calibration Applied | ≤ 75 µs Fine Calibration Applied | ≤ 12.5 µs Offset Calibration Applied |

APPARATUS AND METHOD FOR FAST PHASE LOCKED LOOP (PLL) SETTLING FOR CELLULAR TIME-DIVISION DUPLEX (TDD) COMMUNICATIONS SYSTEMS

CROSS-REFERENCE TO RELATED APPLICATIONS

The present application claims the benefit of U.S. Provisional Patent Appl. No. 61/556,094, filed Nov. 4, 2011, which is incorporated herein by reference in its entirety.

BACKGROUND

1. Field of Disclosure

The present disclosure relates generally to a phase locked loop (PLL) and specifically to calibration of a voltage controlled oscillator (VCO) for the cellular phone.

2. Related Art

Cellular phones have evolved from large devices that were only capable of analog voice communications to comparatively smaller devices that are capable of digital voice communications and digital data communications, such as Short Message Service (SMS) for text messaging, email, packet switching for access to the Internet, gaming, Bluetooth, and Multimedia Messaging Service (MMS) to provide some examples. In addition to these capabilities, the cellular phones of today have additional non-communication related capabilities, such as a camera with video recording, an MPEG-1 Audio Layer 3 (MP3) player, and software applications such as a calendar and a phone book, to provide some examples. Even in light of these capabilities, manufacturers of cellular phones are placing even more capabilities into cellular phones and making these more powerful cellular phones smaller.

At the heart of each cellular phone lies a phase locked-loop (PLL). The PLL is responsible for providing an appropriate transmit frequency for the cellular phone prior to commencement of a transmit mode of operation. The PLL is also responsible for providing an appropriate receive frequency for the cellular phone prior to commencement of a receive mode of operation. In order to properly provide the appropriate transmit and/or receive frequency for the cellular phone, a voltage controlled oscillator (VCO) located within the PLL is calibrated to the appropriate transmit and/or receive frequency of the cellular phone. Once the VCO is initially calibrated to be sufficiently proportional to a frequency and/or a phase of a reference frequency, the PLL locks the frequency of the VCO to be proportional to the frequency and/or the phase of the reference frequency to provide the appropriate transmit and/or receive frequency. Often, additional calibration of the VCO following the initial calibration is often required to ensure that the VCO is sufficiently proportional to the frequency and/or the phase of the reference frequency to the appropriate transmit and/or receive frequency. For example, an additional calibration may be required once the cellular phone transitions from the transmit mode of operation to the receive mode of operation and/or from the receive mode of operation to the transmit mode of operation.

Communications standards provide a certain time window for an initial calibration of the VCO. However, in certain communications standards often do not provide sufficient time for the additional calibration, which is typically necessary when the cellular phone transitions from the transmit mode of operation to the receive mode of operation and/or from the receive mode of operation to the transmit mode of operation. As a result, the cellular phone may not be aligned to the appropriate receive frequency when the cellular phone switches from the transmit mode of operation to the receive mode of operation, for example.

Thus, there is a need to calibrate the VCO following the initial calibration when transitioning from the transmit mode of operation to the receive mode of operation and/or from the receive mode of operation to the transmit mode of operation to the appropriate transmit and/or receive frequency of the cellular phone but to do so within the time allotted in the respective communications standard. Further aspects and advantages of the present disclosure will become apparent from the detailed description that follows.

BRIEF DESCRIPTION OF THE DRAWINGS/FIGURES

Embodiments of the present disclosure are described with reference to the accompanying drawings. In the drawings, like reference numbers indicate identical or functionally similar elements. Additionally, the left most digit(s) of a reference number identifies the drawing in which the reference number first appears.

The present disclosure will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE PRESENT DISCLOSURE

Embodiments of this disclosure include three calibration types in which a communications device may calibrate a phase locked loop (PLL). The three calibration types include a full calibration, a fine calibration, and an offset calibration. The full calibration is to be used by the communications device during a first engagement and/or any subsequent engagement of a communication channel by the communications device. The fine calibration is to be used by the communications device when there is short but sufficient time provided for the communications device to transition between modes of operation. Typically, the time provided for the communications device is determined by the communications standard. The fine calibration includes a scaled down version of the full calibration and optionally applying a pre-determined offset to compensate for the transitioning between the modes of operation. The offset calibration is to be used by the communications device when limited time is provided for the communications device to transition between the modes of operation. The offset calibration includes applying a predetermined offset to compensate for the transitioning between the modes of operation.

The following Detailed Description refers to accompanying drawings to illustrate exemplary embodiments consistent with the present disclosure. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to effect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the present disclosure. Therefore, the Detailed Description is not meant to limit the present disclosure. Rather, the scope of the present disclosure is defined only in accordance with the following claims and their equivalents.

Embodiments of the present disclosure may be implemented in hardware, firmware, software, or any combination thereof. Embodiments of the present disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

The following Detailed Description of the exemplary embodiments will so fully reveal the general nature of the present disclosure that others can, by applying knowledge of those skilled in relevant art(s), readily modify and/or adapt for various applications such exemplary embodiments, without undue experimentation, without departing from the spirit and scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

An Exemplary Communications Device

Figure 1:
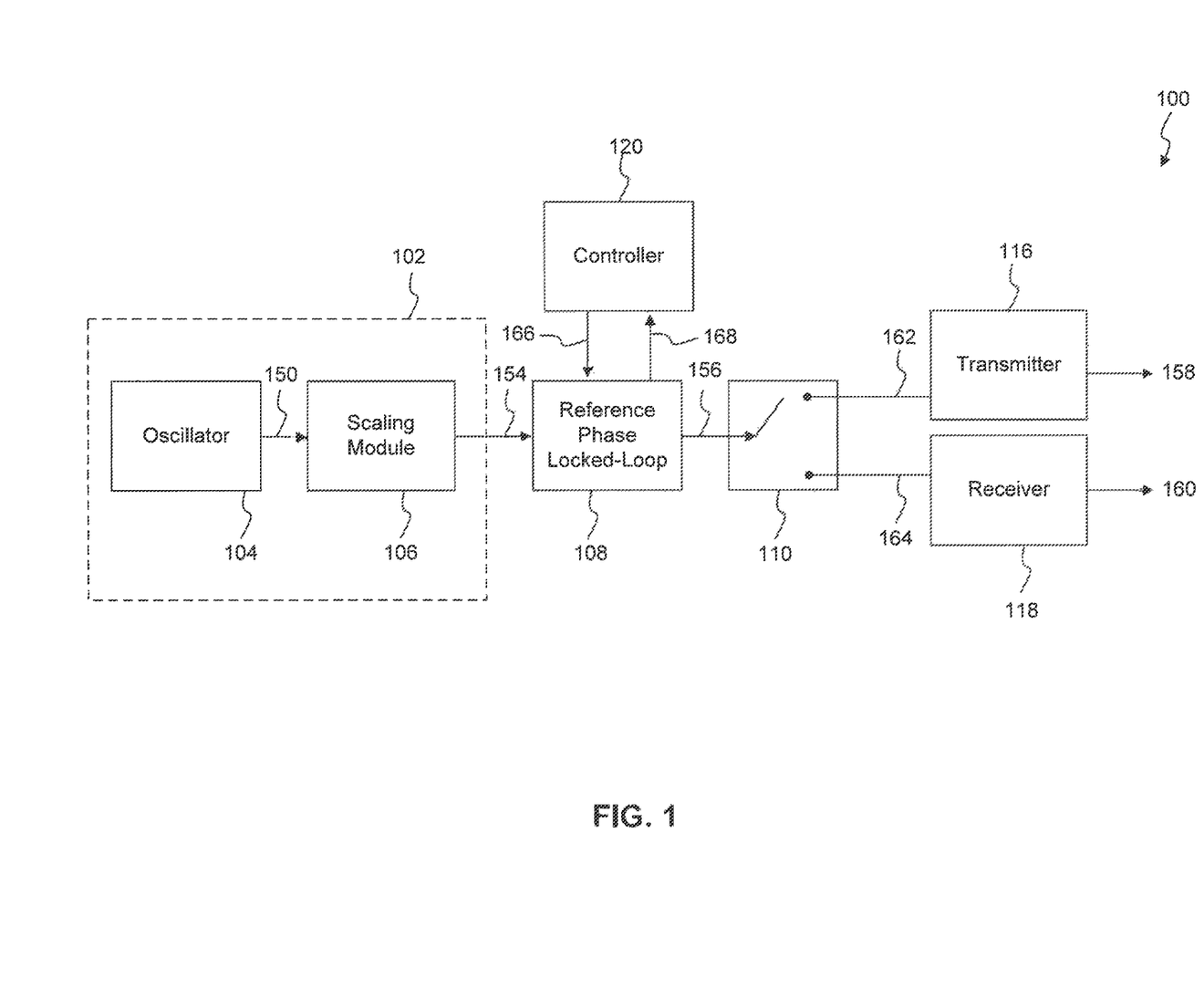
FIG. 1 illustrates a block diagram of a communications device according to an exemplary embodiment of the present disclosure.

FIG. 1 illustrates a block diagram of a communications device according to an exemplary embodiment of the present disclosure. A communications device 100 calibrates a reference phase lock loop (PLL) 108 to provide a target signal 156 that is sufficiently proportional to a reference signal 154. In this situation, the reference PLL 108 is characterized as being in a locked condition whereby the target signal 156 essentially tracks the reference signal 154. For example, the target signal 156 essentially tracks a phase of the reference signal 154 in the locked condition. However, if the target signal 156 is not sufficiently proportional to the reference signal 154, the target signal 156 does not track the reference signal 154. In this situation, the reference PLL 108 is characterized as being in an unlocked condition.

The communications device 100 uses the target signal 156 as a reference signal for a receiver 118 in a receive mode of operation and as a reference signal for a transmitter 116 in a transmit mode of operation. In the receive mode of operation, the receiver 118 is used as a means to receive communications signals from a communications channel. While the transmitter 116 is used as a means to transmit communications signals onto the communications channel in the transmit mode of operation.

The communications device 100 calibrates the reference PLL 108 in either the receive mode of operation or the transmit mode of operation. As to be further discussed below, the communications device 100 adjusts the calibration of the reference PLL 108 to cause the reference PLL 108 enter into the locked condition after switching from the receive mode of operation to the transmit mode of operation and/or from the transmit mode of operation to the receive mode of operation. The communications device 100 adjusts the calibration of the target signal 156 within the time allowed by a communications standard such as Second-Generation Wireless Telephone Technology (2G), Third-Generation Wireless Telephone Technology (3G), Long Term Evolution Frequency-Division Duplexing (LTE MD), Long Term Evolution Time-Division Duplexing (LTE TDD), and Time Division Synchronous Code Division Multiple Access (TD-SCDMA) and/or any other suitable communications standard that will be apparent to those skilled in the relevant art(s) without departing from the spirit and scope of the present disclosure.

As shown in FIG. 1, the communications device 100 includes a reference oscillator 102, the reference PLL 108, a switching module 110, the transmitter 116, the receiver 118, and a controller module 120. The reference oscillator 102 provides the reference signal 154 to the reference PLL 108. The reference signal 154 is related to a desired operating frequency of the communications device 100. For example, a frequency of the reference signal 154 may be approximately equal or an integer or fractional multiple of the desired operating frequency of the communications device 100. The reference oscillator 102 includes an oscillator 104 and an optional scaling module 106. The oscillator 104 provides a reference signal 150. The optional scaling module 106 multiplies and/or divides the reference signal 150 to generate the reference signal 154.

As discussed above, the reference PLL 108 provides the target signal 156 that essentially tracks the reference signal 154 in the locked condition. For example, the reference PLL 108 causes a frequency and/or a phase of the target signal 156 to be approximately equal to a frequency and/or a phase of the target signal 156. As another example, the reference PLL 108 causes the phase of the target signal 156 to be approximately equal to the phase of the target signal 156 and the frequency of the target signal 156 to be proportional to, namely an integer or fractional multiple of, the frequency of the target signal 156.

The switching module 110 may provide the target signal 156 as a transmit reference signal 162 to the transmitter 116 in the transmit mode of operation or as a receive reference signal 164 to the receiver 118 in the receive mode of operation. The reference PLL 108 provides a synthesized transmit signal 162 to the transmitter 116 that may be used to upconvert, to modulate, and/or to encode signals for transmission onto the communications channel. Similarly, the reference PLL 108 provides a synthesized receive signal 164 to the receiver 118 that may be used to downconvert, to demodulate, and/or to decode signals that are received from the communications channel.

The controller module 120 calibrates the reference PLL 108 as the communications device 100 engages the communications channel in a first mode of operation, such as the receive mode of operation to provide an example, and calibrates the reference PLL 108 as the communications device 100 switches from the first mode of operation to a second mode of operation, such as the transmit mode of operation. The controller module 120 monitors an appropriate tuning signal 168 of the reference PLL 108 which is indicative of a difference between the reference signal 154 and the target signal 156. The controller module 120 adjusts the control signal 166 during various calibrations, that are to be discussed below.

The controller module 120 initially calibrates the reference PLL 108 to provide the target signal 156 that is proportional to the frequency and/or the phase of the reference signal 154 when the communications device 100 engages the communications channel. During this initial or full calibration, the controller module 120 executes an extensive calibration cycle to calibrate the reference PLL 108 such that it locks onto the reference signal 154. Typically, this full calibration involves aligning the frequency and/or the phase of the target signal 156 to be sufficiently proportional to the frequency and/or the phase of the reference signal 154 such that the reference PLL 108 may lock onto the reference signal 154. The full calibration of the reference PLL 108 may consume a large quantity of time in order to properly calibrate the target signal 156. For example, the TD-SCDMA communications standard allows at most 120 microseconds to perform the full calibration when the communications device 100 engages the communications channel.

Typically, the controller module 120 performs the full calibration while the communications device 100 is operating in the first mode of operation, such as the receive mode of operation to provide an example. However, those skilled in the relevant art(s) will recognize that the controller module 120 may also perform the full calibration while the communications device 100 is operating in the transmit mode of operation without departing from the spirit and scope of the present disclosure. Following the initial engagement of the communications device 100 to the communications channel in the first mode of operation, the communications device 100 may transition from the first mode of operation to the second mode of operation, such as the transmit mode of operation to provide an example. Ideally, loading of the reference PLL 108 by the receiver 118 in the receive mode of operation is substantially similar to loading of the reference PLL 108 by the transmitter 116 in the transmit mode of operation. However, in practice, an input impedance of the transmitter synthesizer 116 differs from an input impedance of the receiver 118. This difference between the input impedances of the transmitter 116 and the receiver 118 may cause the reference PLL 108 to enter into the unlocked condition as the communications device 100 transitions from the first mode of operation to the second mode of operation. In the unlocked condition, the target signal 156 does not track the reference signal 154 unless the controller module 120 performs another calibration of the reference PLL 108 to cause the reference PLL 108 to once again lock onto the reference signal 154.

However, the controller module 120 may no longer have sufficient time to perform another full calibration of the reference PLL 108 when transitioning from the first mode of operation to the second mode of operation. The amount of time the communications device 100 may take in performing this transition is typically specified by various communications standards. The controller module 120 must perform this other calibration of the reference PLL 108 within these specified times which typically are significantly less than time required to perform the full calibration. For example, the TD-SCDMA communications standard requires the communications device 100 to transition from the transmit mode of operation to the receive mode of operation in approximately 12.5 microseconds; therefore, any calibration of the reference PLL 108 following a transition from the transmit mode of operation to the receive mode of operation must be done in 12.5 microseconds as compared to 120 microseconds allowed for the full calibration. Thus, a shortened calibration is required for the reference PLL 108 when transitioning from the first mode of operation to the second mode of operation.

The controller module 120 may perform the shortened calibration when transitioning from the first mode of operation to the second mode of operation. The shortened calibration allows for a quick adjustment of the target signal 156 while leaving sufficient time for the reference PLL 108 to settle to the locked condition. Some of the communications standards provide for a longer duration of time to transition from the first mode of operation to the second mode of operation when compared to other communications standards. For example, the TD-SCDMA communications standard allows 12.5 microseconds to calibrate when transitioning from the transmit mode of operation to the receive mode of operation and the LTE TDD communications standard allows 47 microseconds to calibrate when transitioning between these modes of operations.

The controller module 120 may perform a fine calibration for those communications standard that specify longer durations of time to transition from the first mode of operation to the second mode of operation and an offset calibration for those communications standard that specify shorter durations of time to transition from the first mode of operation to the second mode of operation. The controller module 120 performs the offset calibration by adjusting the control signal 166 by a predetermined amount. In an exemplary embodiment, the predetermined amount represents a pre-known shifting of the control signal 166 that results from transitioning between the first mode of operation and the second mode of operation. The pre-known shifting of the control signal 166 may be determined from an initial product evaluation of the communications device 100 to determine the shift of the control signal 166 as the communications device transitions.

For example, the controller module 120 calibrates the reference PLL 108 to provide the target frequency 156 at a first frequency in the receive mode of operation during the full calibration. In this example, the target frequency 156 shifts to a second frequency when the communications device 100 transitions from the first mode of operation to a second mode of operation. In this example, the controller module 120 performs the offset calibration to adjust the target frequency 156 from the second frequency to the first frequency. After adjusting the target signal 156 by a predetermined amount, the reference PLL 108 settles to the locked condition within the duration of time specified by the communications standards.

The fine calibration includes the offset calibration, as discussed above, as well as another adjustment of the target frequency 156 to compensate for operational conditions, such as temperature to provide an example, of the communications device 100. Typically, this other adjustment takes sufficiently less time to perform than the full calibration. After adjusting the target signal 156 using the fine calibration, the reference PLL 108 settles to the locked condition within the duration of time specified by the communications standards.

Typically, the offset calibration is less precise than both the full calibration and the fine calibration but requires less time to complete than both the full calibration and the fine calibration. For example, the TD-SCDMA communications standard allows 75 microseconds to calibrate when switching from the receive mode of operation to the transmit mode of operation. The fine calibration may be completed within the 75 microseconds allowed. As a result, the controller module 120 may select the fine calibration over the offset calibration because the 75 microseconds may be sufficient to complete the fine calibration while providing a more precise calibration than the offset calibration. As another example, the TD-SCDMA communications standard limits the time to calibrate when switching from the transmit mode of operation to the receive mode of operation to 12.5 microseconds. The fine calibration may not be completed within the 12.5 microseconds allowed but the offset calibration may be completed within the 12.5 microseconds. As a result, the controller module 120 may select the offset calibration over the fine calibration.

An Exemplary Reference PLL

Figure 2:
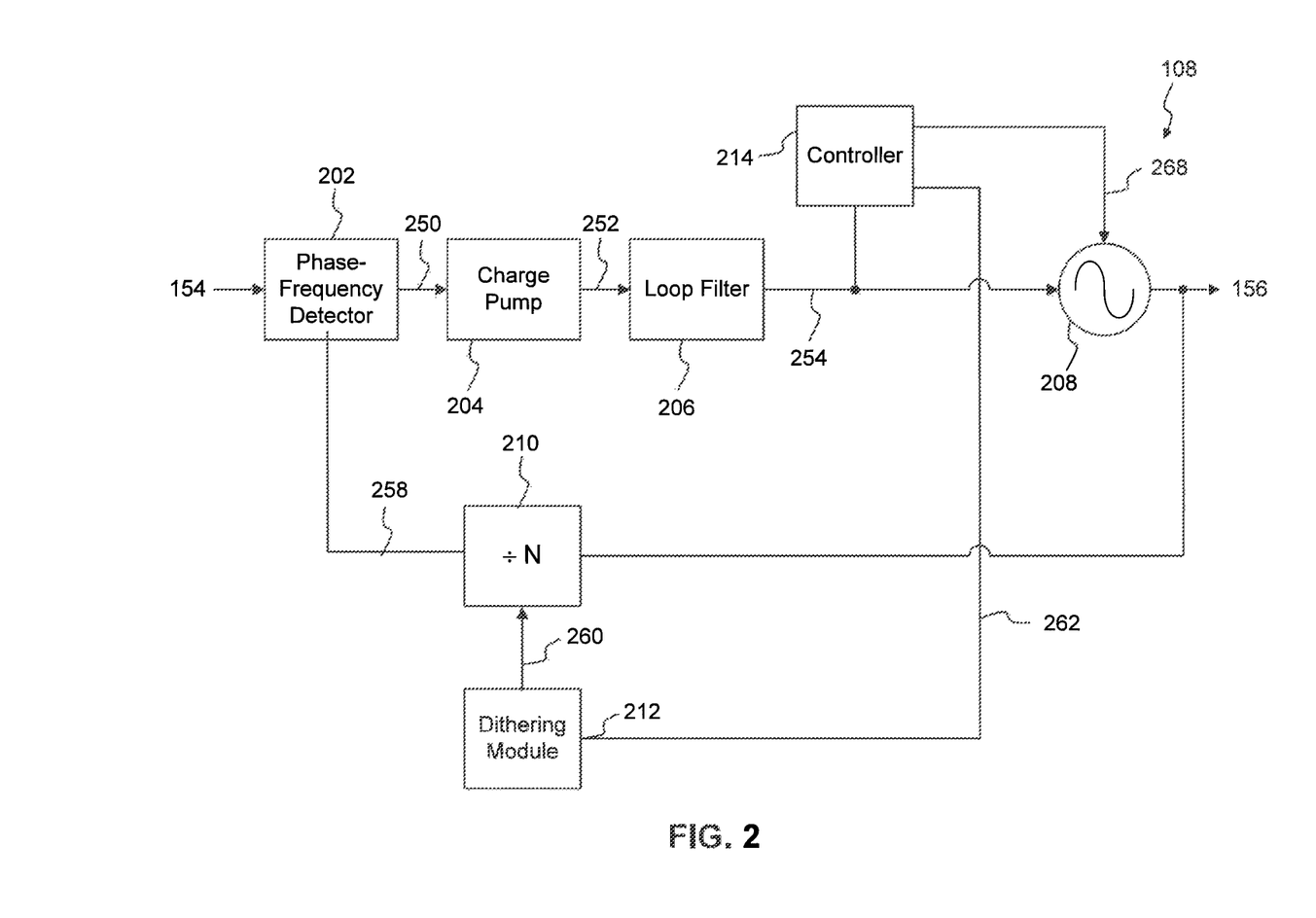
FIG. 2 is a block diagram of a reference PLL that may be used in the communications device according to an exemplary embodiment of the present disclosure.

FIG. 2 is a block diagram of a reference PLL that may be used in the communications device according to an exemplary embodiment of the present disclosure. A reference PLL 200 represents a closed-loop feedback control system that generates the target signal 156 in relation to a frequency and a phase of the reference signal 154. In other words, the reference PLL 200 performs frequency multiplication and/or division, via a negative feedback mechanism, to generate the target signal 156 in terms of the reference signal 154. The reference PLL 200 may be implemented using a phase/frequency detector (PFD) 202, a charge pump 204, a loop filter 206, a voltage controlled oscillator (VCO) 208, an optional integer frequency divider 210, an optional dithering module 212, and a controller 214. The reference PLL 200 may represent an exemplary embodiment of the reference PLL 108.

The PFD 202 converts a difference between the frequency and/or the phase of the reference signal 154 and a phase and/or a frequency of a divided feedback signal 258 into an error signal 250. Specifically, the PFD 202 produces the error signal 250 by comparing the frequency and/or the phase of the divided feedback signal 258 and the frequency and/or the phase of the reference signal 154 to detect for deviations between the reference signal 154 and the divided feedback signal 258. When the phase and the frequency of the error signal 250 and the phase and the frequency of the divided feedback signal 258 are substantially equivalent, the reference PLL 200 is in the locked condition. In the locked condition, the error signal 250 is proportional to the phase difference between the reference signal 154 and the divided feedback signal 258.

The charge pump 204 converts the error signal 250 to a voltage/current domain representation, denoted as a charge pump output 252, to control the frequency of the VCO 208. When the reference PLL 200 is the unlocked condition, the charge pump 204 increases or decreases the charge pump output 252 based on the error signal 250. When the reference PLL 200 is in the locked condition the error signal 250 is minimized and the charge pump 204 maintains the charge pump output 252 at a substantially fixed value.

The loop filter 206 may be used to remove undesirable noise from the charge pump output 252 to generate a tuning signal 254. The loop filter 206 may be implemented as a low pass filter to suppress high frequency components in the charge pump output 252 to allow a direct current (DC), or near DC, component of the charge pump output 252 to control the VCO 208. The loop filter 206 also maintains stability of the reference PLL 200.

The VCO 208 is a voltage to frequency converter. Specifically, the VCO 208 produces the target signal 156 based upon the tuning signal 254 and the frequency control signal 268. Typically, the controller 214 adjusts the frequency control signal 268 until the target signal 156 is sufficiently related to the reference signal 154 during the full calibration. For example, the controller 214 may cycle through different combinations of the frequency control signal 268 using a searching algorithm, such as a binary search tree algorithm, a recursion algorithm, a Stern-Brocot algorithm and/or any other suitable search that will be apparent to those skilled in the relevant art(s) without departing from the spirit and scope of the present disclosure until the target signal 156 is sufficiently related to the reference signal 154. The tuning signal 254 is used to further adjust the target signal 156 until it is approximately equal or an integer or fractional multiple of the reference signal 154. In an exemplary embodiment, the frequency control signal 268 used to coarsely steer the target signal 156 to be sufficiently related to the reference signal 154 to allow the VCO 208 to lock onto the reference signal 154 by finely steering the target signal 156 using the tuning signal 254.

The optional integer frequency divider 210 is located in a feedback path of the reference PLL 200. The optional integer frequency divider 210 divides the target signal 156 by an integer N to provide the divided feedback signal 258. The optional integer frequency divider 210 may adjust the integer N in response to a channel transmission signal 262.

The optional dithering module 212 allows the reference PLL 200 to dither the divide value over time between two or more integer values to obtain an effective time averaged fractional division factor. More specifically, the optional dithering module 212 selects between the two or more integer values for each iteration of the reference PLL 200 in response to a division code 260, so that on average, a fractional division factor can be represented. The optional dithering module 212 generates the division code 260 in response to the divide ratio control signal 262.

The controller module 214 calibrates the reference PLL 200 in one of the full calibration, the fine calibration, and/or the offset calibration. The controller module 214 illustrates an exemplary implementation of the full calibration, the fine calibration, and/or the offset calibration that were discussed above. The controller module 214 initially calibrates the reference PLL 200 to provide the target signal 156 that is proportional to the frequency and/or the phase of the reference signal 154 when a communications device, such as the communications device 100 to provide an example, engages a communications channel.

The controller module 214 may provide the channel transmission signal 262 that causes the optional dithering module 212 to provide the divide ratio control signal 262 that corresponds to the communications channel. The controller module 214 provides a first value for the frequency control signal 268 to cause the VCO 208 to provide the target signal 156 at a first frequency. The controller module 214 monitors the tuning signal 254 once the target signal 156 has reached the first frequency. The controller module 214 compares the tuning signal 254 to a predetermined tuning signal to determine whether the reference PLL 200 is in the locked condition. The predetermined tuning signal represents a pre-known tuning signal that is presented within the reference PLL 200 when the reference PLL 200 is the locked condition. For example, the pre-known tuning signal may represent a DC voltage when the reference PLL 200 is the locked condition. The controller module 214 compares a magnitude of a difference between the tuning signal 254 and the pre-known tuning signal to a locking threshold. When magnitude of the difference is less than or equal to the locking threshold, the target signal 156 is sufficiently related to the reference signal 154. In this situation, the reference PLL 200 enters in the locked condition to track the reference signal 154.

However, when the magnitude of the difference is greater than the locking threshold, the target signal 156 is not sufficiently related to the reference signal 154. In this situation, the reference PLL 200 is in the unlocked condition. The controller module 214 then provides a second value for the frequency control signal 268 to cause the VCO 208 to provide the target signal 156 at a second frequency. The controller module 214 determines whether the second frequency causes the reference PLL 200 to enter into the locked condition. If not, the controller module 214 continues to adjust the frequency control signal 268 until the VCO 208 enters into the locked condition. However, this example is not limiting, those skilled in the relevant art(s) will recognize that other methods may be used in tuning the reference PLL 200 so that the reference PLL 200 enters into the locked condition.

After receiving communications signals from the communications channel in the receive mode of operation, the communications device may transition from the receive mode of operation to the transmit mode of operation. After transmitting communications signal onto the communications channel, the communications device may transition from the transmit mode of operation back to the receive mode of operation or engage another communications channel. As discussed above, the controller module 214 may calibrate the reference PLL 200 using the fine calibration, and/or the offset calibration while the communications device is transitioning between these modes of operation. Typically, selection of the fine calibration and or the offset calibration is based on the communications standard in which the communications device is operating.

Figure 3:
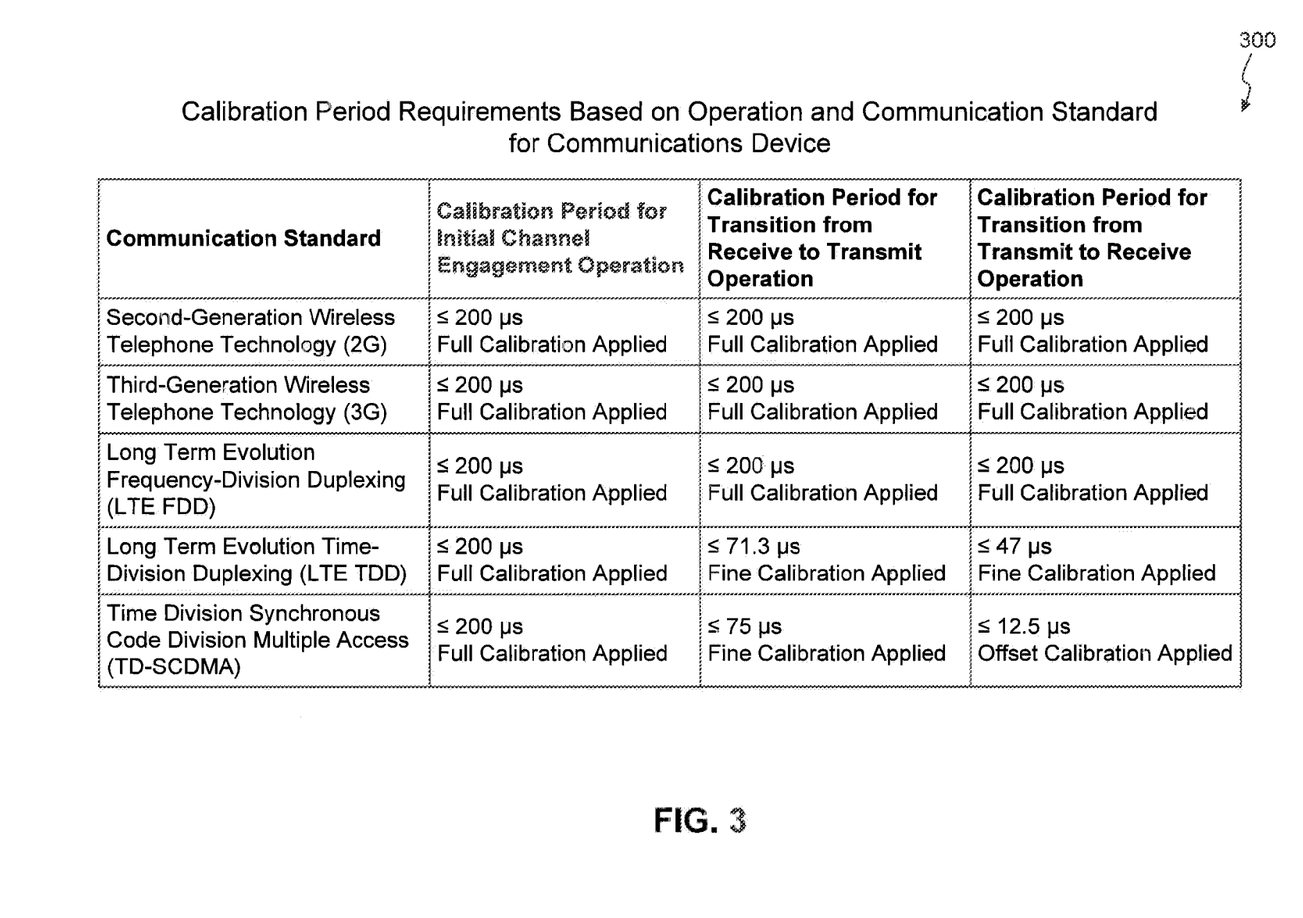
FIG. 3 is a table that represents each type of calibration that may be used by the communications device based on the communications standard and the operation to be performed by the communications device.

For example, as shown in FIG. 3, the communications device may be operating in the LTE TDD standard. When the communications device transitions from the receive mode of operation to the transmit mode of operation, the LTE TDD standard allows 71.3 microseconds for the controller module 214 to calibrate the VCO 208 so that the reference PLL 200 locks onto the reference signal 154. In this situation, the controller module 214 selects the fine calibration when the communications device is transitioning from the receive mode of operation to the transmit mode of operation.

As another example, also shown in FIG. 3, the communications device may be operating in the TD-SCDMA standard. When the communications device transitions from the transmit mode of operation to the receive mode of operation, the TD-SCDMA standard allows 12.5 microseconds for the controller module 214 to calibrate the VCO 208 so that the reference PLL 200 locks onto the reference signal 154. In this situation, the controller module 214 selects the offset calibration when the communications device is transitioning from the transmit mode of operation to the receive mode of operation because the LTE TDD standard provides sufficient time to complete the offset calibration but not sufficient time to complete the fine calibration.

The controller module 214 performs the offset calibration by adjusting the target signal 156 by the predetermined amount that relates to a shifting of the target signal 156 that results from transitioning between modes of operation. Typically, the predetermined amount represents a predetermined voltage and/or current that is coupled onto the tuning signal 254 and/or shifting of the VCO tuning elements. This predetermined voltage, current, and/or VCO tuning elements shift the target signal 156 to accommodate for the difference that results from transitioning between modes of operation. After adjusting the target signal 156 by the predetermined amount, the reference PLL 200 settles to the locked condition within the duration of time specified by the communications standards.

The fine calibration includes the offset calibration, as discussed above, as well as another adjustment of the target frequency 156 to compensate for operational conditions, such as temperature and/or power supply to provide an example, of the communications device. The controller module 214 adjusts the target signal 156 by the predetermined amount in a substantially similar manner as the offset calibration. The controller module 214 additionally adjusts the target signal 156 to compensate for the operational conditions. Typically, this operational adjustment may be characterized as being similar to the full calibration, but scaled down. The controller module 214 provides a predetermined number of different values for the frequency control signal 268 to cause the VCO 208 to provide the target signal 156 at different frequencies. In an exemplary embodiment, the predetermined number of different values represents two different combinations of the searching algorithm. However, this example is not limiting, those skilled in the relevant art(s) will recognize that the predetermined number of different values may represent any suitable number of different combinations of the searching algorithm so long as the fine calibration is completed within the time allotted by the communications standard without departing from the spirit and scope of the present disclosure.

An Exemplary Calibration Requirement Table for Different Communications Standards FIG. 3 is a table that represents each type of calibration that may be used by the communications device for different communications standards according to an exemplary embodiment of the present disclosure. FIG. 3 includes exemplary communications standards in which a communications device, such as the communications device 100 to provide an example may operate in; however, those skilled in the relevant art(s) will recognize that the communications device may operate in accordance with other communications standards without departing from the spirit and scope of the present disclosure.

For each communications standard, FIG. 3 depicts the time allowed by each respective communications standard for a controller module, such as the controller module 120 or the controller module 214 to provide some examples, to calibrate a reference PLL, such as the reference PLL 108 or the reference PLL 200 to provide some examples. For example, FIG. 3 depicts that the TD-SCDMA communications standard allows 200 microseconds for the controller module to properly calibrate the reference PLL when the communications device engages a communications channel. The 200 microseconds provided by the TD-SCDMA communications standard may be sufficient to perform the full calibration. However, the calibration period for the transition from the receive mode of operation to the transmit mode of operation provided by the TD-SCDMA is 75 microseconds. The 75 microseconds may be sufficient to perform the fine calibration but not sufficient to perform the full calibration. Further, the calibration period for the transition from the transmit mode of operation to the receive mode of operation provided by the TD-SCDMA is 12.5 microseconds. The 12.5 microseconds may be sufficient to perform the offset calibration but not sufficient to perform the full calibration and/or the fine calibration.

An Exemplary Voltage Controlled Oscillator (VCO)

Figure 4:
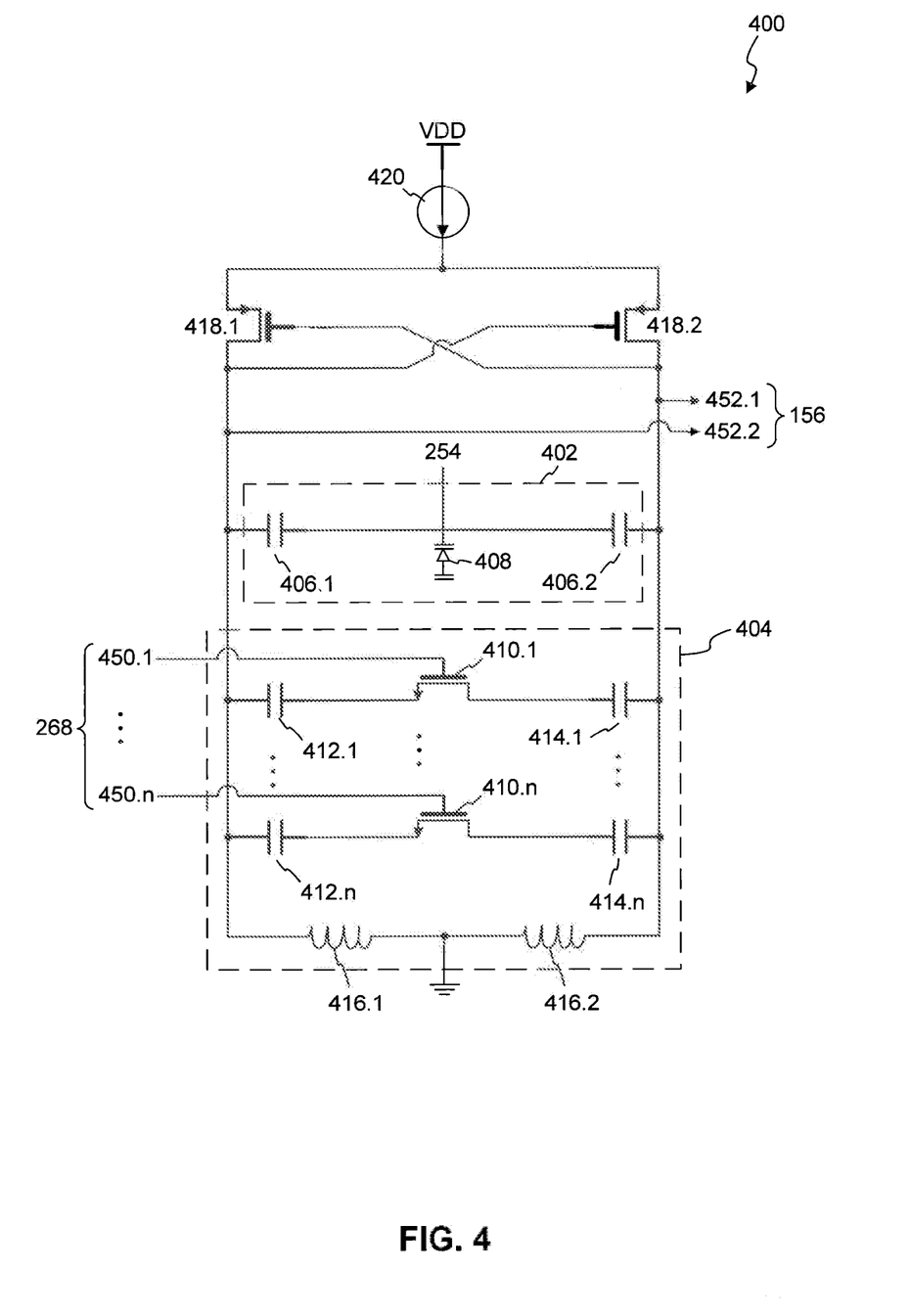
FIG. 4 illustrates a block diagram of a VCO according to an exemplary embodiment of the present disclosure.

FIG. 4 Illustrates a Block Diagram of an Exemplary Voltage Controlled oscillator (VCO) that may be used in the communications device according to an exemplary embodiment of the present disclosure. A controller module, such as the controller module 120 or the controller module 214 to provide some examples, calibrates a VCO 400 in one of the full calibration, the fine calibration, and/or the offset calibration to provide target outputs 452.1 and 452.2. The target outputs 452.1 and 452.2 represent an exemplary embodiment of the target output 156. The VCO 400 includes a fine frequency component 402 and a course frequency component 404 which operate in conjunction with each other to provide the target signal 156.

The fine frequency component 402 includes a first fine capacitor 406.1, a second fine capacitor 406.2, and a varactor diode 408. As shown in FIG. 4, the tuning signal 254 is applied to the varactor diode 408. The varactor diode 408 represents a variable capacitance whose capacitance is a function of the tuning signal 254. The first fine capacitor 406.1 and the second fine capacitor 406.2 are coupled to the varactor diode 408 to isolate the tuning signal 254 from the course frequency component 404. Typically, the first fine capacitor 406.1 and the second fine capacitor 406.2 represent large capacitors when compared to the varactor diode 408 such that a capacitance of the fine frequency component 402 is dominated by the varactor diode 408.

The coarse frequency component 404 includes transistor switches 410.1 through 410.n, first capacitors 412.1 through 412.n, second capacitors 414.1 through 414.n, a first inductor 416.1 and a second inductor 416.2. The switches 410.1 through 410.n cause their corresponding first capacitors 412.1 through 412.n and second capacitors 414.1 through 414.n to contribute to a capacitance of the coarse frequency component 404 when activated by a corresponding frequency control signal 450.1 through 450.n. The frequency control signals 450.1 through 450.n represent an exemplary embodiment of the frequency control signal 268. In other words, the first capacitors 412.1 through 412.n and second capacitors 414.1 through 414.n are switched in and out of the coarse frequency component 404 by their corresponding switches 410.1 through 410.n. In an exemplary embodiment, the coarse frequency component 404 may include first capacitors 412.1 through 412.8 and second capacitors 414.1 through 414.8. Those capacitors that are switched in the course frequency component 404 contribute to the capacitance of the course frequency component 404 while those capacitors that are switched out of the course frequency component 404 do not. The first inductor 416.1, the second inductor 416.2, and the first capacitors 412.1 through 412.n and the second capacitors 414.1 through 414.n that are switched in the course frequency component 404 are configured and arranged to form a resonant circuit.

The VCO 400 may include an oscillator core formed by the transistors 418.1 and 418.2, and a biasing current source 420.

The controller module provides various frequency control signal 450.1 through 450.n to switch various first capacitors 412.1 through 412.n and various second capacitors 414.1 through 414.n in and out of the coarse frequency component 404 during the full calibration. The various frequency control signals 450.1 through 450.n are determined in accordance with the searching algorithm. The switching in and out of the first capacitors 412.1 through 412.n and the second capacitors 414.1 through 414.n in this manner adjusts a frequency of the target outputs 452.1 and 452.2. Typically, the frequency of the target outputs 452.1 and 452.2 is inversely related to the capacitance of the coarse frequency component 404. The controller module continuously switches the first capacitors 412.1 through 412.n and the second capacitors 414.1 through 414.n in accordance with the searching algorithm until the target outputs 452.1 and 452.2 are sufficiently related to the reference signal 154 to allow the VCO 400 to lock onto the reference signal 154 by finely adjusting the capacitance of the fine frequency component 402 using the tuning signal 254.

The controller module adjusts the capacitance of the fine frequency component 402 and/or adjusts frequency control signals 450.1 through 450.n by the predetermined amount during the offset calibration.

The controller module adjusts the capacitance of the fine frequency component 402 by the predetermined amount and adjusts the frequency control signals 450.1 through 450.n by enabling a scaled down version of the full calibration cycle to adjust the capacitance of the coarse frequency component 404 during the fine calibration.

An Exemplary Operational Control Flow of the Communication Device

Figure 5:
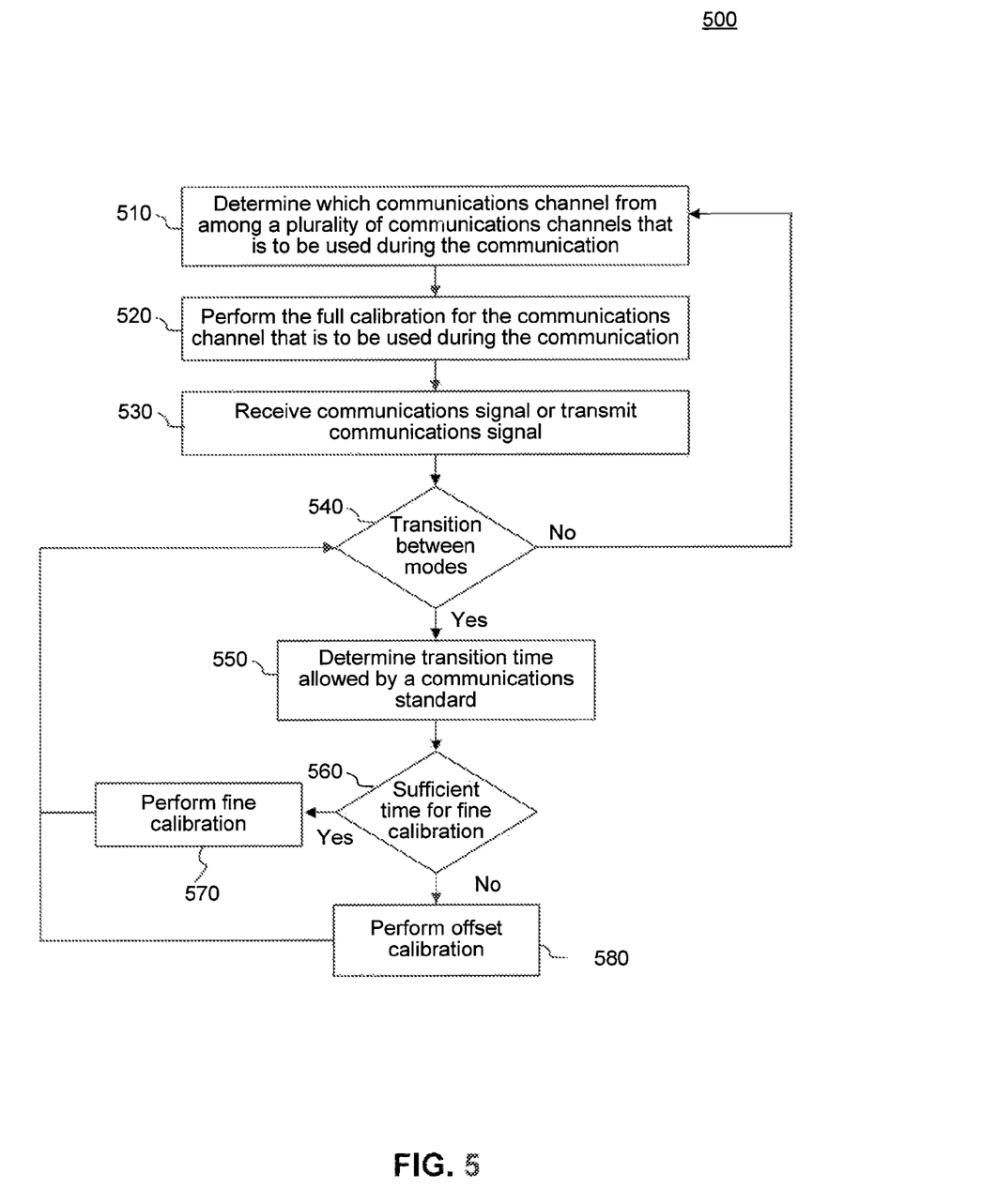
FIG. 5 is a flowchart of exemplary operational steps of the communications device according to an exemplary embodiment of the present disclosure.

FIG. 5 is a flowchart of exemplary operational steps of the communications device according to an exemplary embodiment of the present disclosure. The present disclosure is not limited to this operational description. Rather, it will be apparent to persons skilled in the relevant art(s) from the teachings herein that other operational control flows are within the scope and spirit of the present disclosure. The following discussion describes the steps in FIG. 5.

At step 510, the operational control flow determines a communications channel from among a plurality of communications channels that is to be used by a communications device to transmit and/or receive a communications signal.

At step 520, the operational control flow performs the full calibration to calibrate the communications device for the communications channel. Specifically, the operational control flow adjusts a reference PLL, such as the reference PLL 108 or the reference PLL 200 to provide some examples, within the communications device to lock onto a reference signal, such as reference signal 154 to provide an example.

At step 530, the operational control flow receives the communications signal from step 510 from the communications channel from step 510 and/or transmits the communications signal from step 510 onto the communications channel from step 510.

At step 540, the operational control flows determines whether the communications device is to select another communications channel from among the plurality of communications channels or to transition from the receive mode of operation to the transmit mode of operation or from the transmit mode of operation to the receive mode of operation. For example, the operational control flow determines whether the communications device is to subsequently transmit another communications onto the communications channel from step 510 after receiving the communications signal from step 510 from the communications channel from step 510. As another example, the operational control flow determines whether the communications device is to subsequently receive another communications from the communications channel from step 510 after transmit the communications signal from step 510 onto the communications channel from step 510.

The operational control flow proceeds to step 550 to transition between these modes of operation or reverts back to step 510 to select another communications channel.

At step 540, the operational control flow determines whether the communications device is to transition between the modes of operation of step 530. If so, the operational control flow proceeds to step 550, otherwise, the operational control reverts to step 510 to determine another communications signal.

At step 550, the operational control flow determines the operation transition time allowed by a communications standard. For example, the operational control flow transitions from the transmit mode of operation to the receive mode of operation while operating in the TD-SCDMA communications standard. In this example, the operational control flow determines the transition time allowed by the TD-SCDMA communications standard to transition from the transmit mode of operation to the receive mode of operation which is approximately 12.5 microseconds.

At step 560, the operational control flow determines whether the communications standard provides sufficient time to calibrate the communications device using the fine calibration. If so, the operational control flow proceeds to step 570. Otherwise, the operational control flow proceeds to step 580.

At step 570, the operational control flow performs the fine calibration then reverts to step 540.

At step 580, the operational control flow performs the offset calibration then reverts to step 540.

CONCLUSION

It is to be appreciated that the Detailed Description section, and not the Abstract section, is intended to be used to interpret the claims. The Abstract section may set forth one or more, but not all exemplary embodiments, of the present disclosure, and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the present disclosure. Thus the present disclosure should not be limited by any of the above-described exemplary embodiments, but should be defined only in accordance with the following claims and their equivalents.

What is claimed is:

1. A communications device, comprising:
a reference phase-locked loop (PLL) configured to provide a target signal; and
a controller configured:
to perform a first calibration routine on the reference PLL to adjust a target signal to track a reference signal when the communications device enters into a first mode of operation, and
to perform a second calibration routine on the reference PLL to adjust the target signal to track the reference signal when the communications device is transitioning from the first mode of operation to a second mode of operation,
wherein the communications device is further configured to allocate more time to the controller to perform the first calibration routine than to perform the second calibration routine.

2. The communications device of claim 1, wherein the first mode of operation is a receive mode of operation, and wherein the second mode of operation is a transmit mode of operation.

3. The communications device of claim 1, wherein the first mode of operation is a transmit mode of operation, and wherein the second mode of operation is a receive mode of operation.

4. The communications device of claim 1, wherein the reference PLL comprises:
a voltage controlled oscillator (VCO) configured to provide the target signal in response to a tuning signal,
wherein the controller is configured to couple a first control signal in the first mode of operation or a second control signal in the second mode of operation onto the tuning signal to adjust the target signal.

5. The communications device of claim 1, wherein the communications device is configured to operate in accordance with a communications standard.

6. The communications device of claim 5, wherein the communications standard comprises:
Long Term Evolution Time-Division Duplexing (LTE TDD); or
Time Division Synchronous Code Division Multiple Access (TD-SCDMA).

7. The communications device of claim 1, wherein the controller is configured to perform the first calibration routine when the communications device engages a communications channel.

8. The communications device of claim 7, wherein the first calibration routine comprises:
a searching algorithm that is performed when the communications device engages the communications channel.

9. The communications device of claim 1, wherein the second calibration routine comprises:
applying a pre-determined offset to compensate for the transitioning between the first mode of operation and the second mode of operation.

10. The communications device of claim 9, wherein the second calibration routine further comprises:
compensating for operating conditions of the communications device.

11. A communications device, comprising;
a reference phase-locked loop (PLL) configured to provide a target signal; and
a controller configured to calibrate the reference PLL in a time allotted by a communications standard to transition from a first mode of operation to a second mode of operation such that the target signal tracks a reference signal when the communications device transitions from the first mode of operation to the second mode of operation,
wherein the controller is further configured to calibrate the reference PLL by adjusting a target frequency by a pre-determined amount, the predetermined amount representing a pre-know shifting of a tuning signal that results from transitioning between the first mode of operation and the second mode of operation.

12. A method for calibrating a reference phase-locked loop (PLL) when a communications device transitions from a first mode of operation to a second mode of operation, the method comprising:
allocating more time to perform a first calibration routine than to perform a second calibration routine;
performing the first calibration routine to adjust a tuning signal until a target signal tracks a reference signal when the communications device enters into the first mode of operation; and performing the second calibration routine on the reference PLL to adjust the tuning signal until the target signal tracks the reference signal when the communications device is transitioning from the first mode of operation to the second mode of operation.

13. The method of claim 12, wherein the first mode of operation is a receive mode of operation, and
wherein the second mode of operation is a transmit mode of operation.

14. The method of claim 12, wherein the first mode of operation is a transmit mode of operation, and
wherein the second mode of operation is a receive mode of operation.

15. The method of claim 12, wherein performing the first calibration routine comprises:
coupling a first control signal onto the tuning signal of a voltage controlled oscillator (VCO) to adjust the target signal, and
wherein performing the second calibration routine comprises:
coupling a second control signal onto the tuning signal of the VCO to adjust the target signal.

16. The method of claim 12, wherein the communications device is configured to operate in accordance with a communications standard.

17. The method of claim 16, wherein the communications standard comprises:
Long Term Evolution Time-Division Duplexing (LTE TDD); or
Time Division Synchronous Code Division Multiple Access (TD-SCDMA).

18. The method of claim 12, wherein performing the first calibration routine comprises:
adjusting the tuning signal using a searching algorithm when the communications device engages a communications channel.

19. The method of claim 12, wherein performing the second calibration routine comprises:
applying a pre-determined offset to compensate for the transitioning between the first mode of operation and the second mode of operation.

20. The method of claim 19, wherein performing the second calibration routine further comprises:
compensating for operating conditions of the communications device.

* * * * *

UNITED STATES PATENT AND TRADEMARK OFFICE
CERTIFICATE OF CORRECTION

PATENT NO. : 8,611,842 B2
APPLICATION NO. : 13/356137
DATED : December 17, 2013
INVENTOR(S) : Nikolaos Haralabidis It is certified that error appears in the above-identified patent and that said Letters Patent is hereby corrected as shown below:

Title page, Item (75) Inventors, replace "Nikoloas Haralabidis" with --Nikolaos Haralabidis--.

Signed and Sealed this
Twenty-ninth Day of April, 2014

Michelle K. Lee
*Deputy Director of the United States Patent and Trademark Office*